US006147495A

United States Patent [19]
DeMeester et al.

[11] Patent Number: 6,147,495
[45] Date of Patent: Nov. 14, 2000

[54] MAGNETIC RESONANCE IMAGING WITH INTEGRATED POLEFACE FEATURES

[75] Inventors: Gordon D. DeMeester, Wickliffe, Ohio; John V. M. McGinley, London; Ian R. Young, Wiltshire, both of United Kingdom

[73] Assignee: Picker International, Inc., Highland Heights, Ohio

[21] Appl. No.: 09/141,990

[22] Filed: Aug. 28, 1998

[51] Int. Cl.[7] .................................................... G01V 3/00
[52] U.S. Cl. .......................... 324/320; 324/319; 335/296
[58] Field of Search .................................... 324/319, 320, 324/318, 300, 307, 309; 335/296, 297

[56] References Cited

U.S. PATENT DOCUMENTS

| | | | |
|---|---|---|---|
| 4,766,378 | 8/1988 | Danby et al. | 324/307 |
| 5,134,374 | 7/1992 | Breneman et al. | 324/319 |
| 5,162,768 | 11/1992 | McDougall et al. | 335/296 |
| 5,436,607 | 7/1995 | Chari et al. | 335/216 |
| 5,627,471 | 5/1997 | Kinanen | 324/319 |
| 5,864,275 | 1/1999 | Ohashi et al. | 335/306 |

*Primary Examiner*—Louis Arana
*Attorney, Agent, or Firm*—Fay, Sharpe, Fagan, Minnich & McKee, LLP

[57] ABSTRACT

A magnetic resonance imaging scanner includes a pair of opposing pole pieces (20, 20') disposed symmetrically about an imaging volume (24) facing one another. The pair of opposing pole pieces (20, 20') includes a first ferrous pole piece (20) which has a front side (22) facing the imaging volume (24) and a back side (28). Also included is a second ferrous pole piece (20') which also has a front side (22) facing the imaging volume (24) and a back side (28). A magnetic flux return path (30) extends, remotely from the imaging volume (24), between a point adjacent the back side 28 of the first pole piece (20) and a point adjacent the back side 28' of the second pole piece (20)'. A source of magnetic flux generates a magnetic flux through the imaging volume (24), the pair of opposing pole pieces (20, 20'), and the magnetic flux return path (30). An array of annular hoops (40) and (40') are integrated with the pair of opposing pole pieces (20, 20') for homogenizing the magnetic flux through the imaging volume (24). The annular hoops (40, 40') are made of a material having magnetic properties different from those of the pair of opposing pole pieces (20, 20').

19 Claims, 2 Drawing Sheets

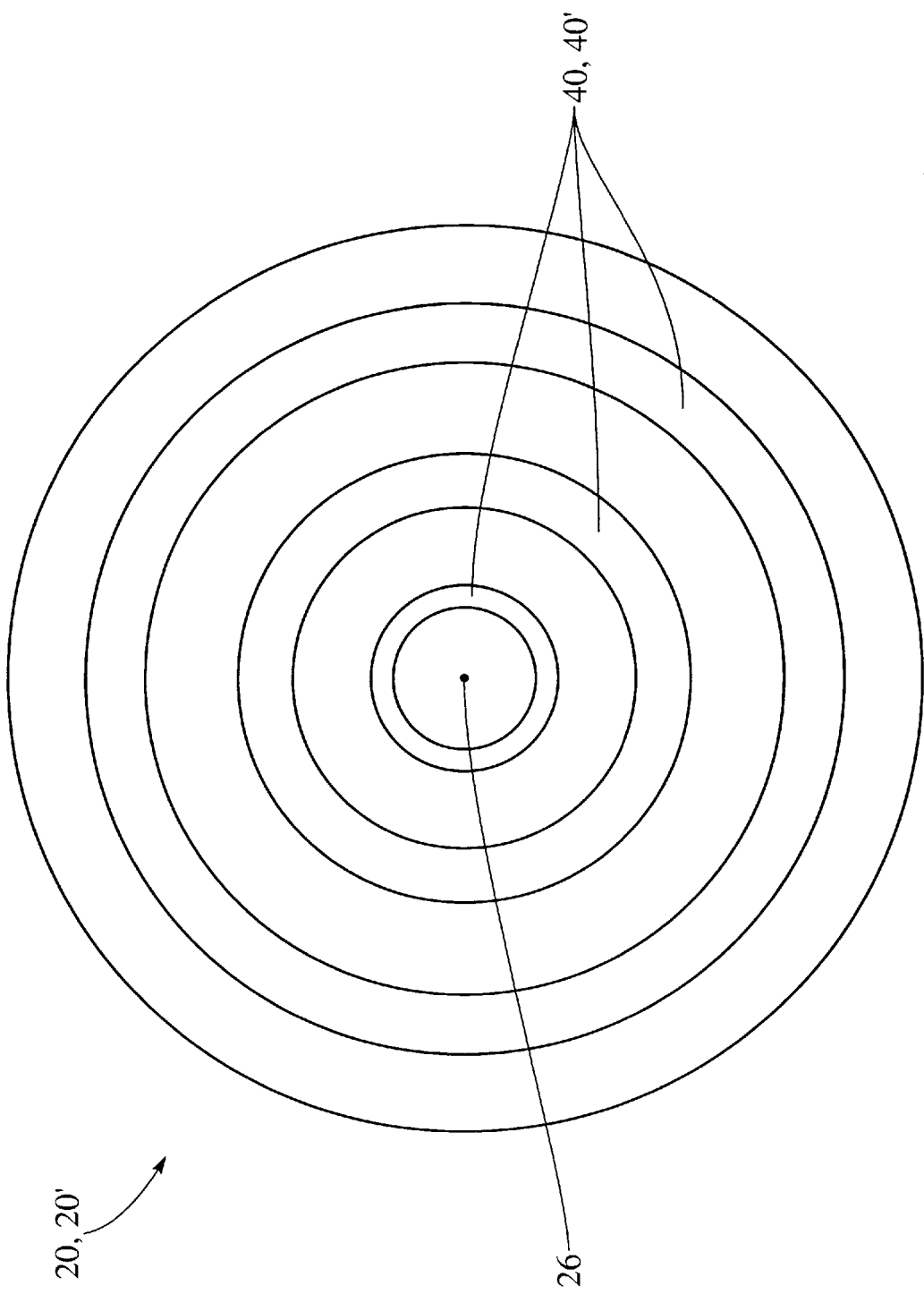

MAGNETIC RESONANCE IMAGING WITH INTEGRATED POLEFACE FEATURES

BACKGROUND OF THE INVENTION

The present invention relates to the art of magnetic resonance imaging (MRI). It finds particular application in conjunction with open geometry magnet systems, and will be described with particular reference thereto. However, it is to be appreciated that the present invention is also amenable to other like applications where high-quality homogenous magnetic fields are desired.

One common type of MRI system has a patient receiving bore through which a main magnetic field is generated longitudinally by a surrounding series of annular magnet windings. A patient or subject is selectively translated axially along a horizontal central axis of the bore to have a region of interest positioned in an imaging volume for imaging. In these solenoid type annular bore systems, access to the patient for surgical and/or invasive procedures, physiological tests, equipment, and the like is limited and awkward. Moreover, such systems tend to be claustrophobic for some patients.

To provide for access and reduce the claustrophobic effect in patients, open or vertical field magnets have been developed. Open magnets typically include a ferrous flux return path in the form of a "C", "H", or four-poster arrangement. The flux return paths have an open gap or patient receiving region within which the patient or subject is disposed for imaging. Typically, two annular magnets are disposed on opposing sides of the gap to generate the main magnetic field or magnetic flux therethrough. Due to the difference in the susceptibility of the flux return path and the air in the gap, there tends to be non-uniformity and other magnetic flux errors in the gap. However, high image quality is dependent on having the main magnetic field in the imaging volume as homogeneous and perturbation free as possible. In order to generate a stronger, more uniform magnetic flux through the gap, ferrous pole pieces are typically positioned at the ends of the flux return path on either side of the gap or patient receiving region. In some cases, the pole pieces are shaped and contoured with features such as annular ridges and grooves, as appropriate, to generate a more uniform or homogeneous magnetic flux between the pole pieces. For example, see U.S. Pat. Nos. 5,436,607 and 5,162,768 which show contoured and/or shaped pole pieces for enhancing the magnetic field in the imaging volume.

Although the use of contoured and/or shaped pole pieces has certain advantages, there are trade-offs. In particular, with reference to the '607 patent, one trade-off is that the features are concentrated on the back sides of the poles so as not to reduce the patient gap. Poles with contour features on the front side thereof are considered advantageous over those having features on the back because contour features are generally more effective the closer they are to the imaging volume. At higher field strengths, to achieve the same level of effectiveness as at lower field strengths, the contoured features are more pronounced (i.e. the grooves are deeper, etc.). This sensitivity to position of pole shaping features allows some designs to be realized with poleface features that cannot be realized with shaping behind the pole.

The present invention contemplates a new and improved pole piece and MRI scanner employing the same which overcomes the above-referenced problems and others.

SUMMARY OF THE INVENTION

In accordance with one aspect of the present invention, an MRI scanner is provided. It includes a pair of opposing pole pieces disposed symmetrically about an imaging volume facing one another. The pair of opposing pole pieces includes a first ferrous pole piece having a front side facing the imaging volume and a back side. As well, a second ferrous pole piece also has a front side facing the imaging volume and a back side. A magnetic flux return path extends, remotely from the imaging volume, between a point adjacent the back side of the first pole piece and a point adjacent the back side of the second pole piece. A source of magnetic flux generates a magnetic flux through the imaging volume, the pair of opposing pole pieces, and the magnetic flux return path. A number of annular hoops are integrated with the pair of opposing pole pieces for homogenizing the magnetic flux through the imaging volume. The annular hoops are made out of a material having magnetic properties different than those of the pair of opposing pole pieces.

In accordance with a more limited aspect of the present invention, some or all of the annular hoops are made from permanent magnets.

In accordance with a more limited aspect of the present invention, at least one of the annular hoops is magnetically aligned with the magnetic flux in the imaging volume such that some of the magnetic flux in the imaging volume is concentrated in a region of at least one annular hoop.

In accordance with a more limited aspect of the present invention, at least one of the annular hoops is magnetically anti-aligned with the magnetic flux in the imaging volume such that the magnetic flux in the imaging volume is reduced in a region of the at least one annular hoop.

In accordance with a more limited aspect of the present invention, the material from which the annular hoops are made is selected from a group consisting of, among others, neodymium boron iron, samarium cobalt, a nickel iron alloy, and a cobalt steel alloy.

In accordance with a more limited aspect of the present invention, the material from which the annular hoops are made has a magnetic susceptibility different than that of the pair of opposing pole pieces.

In accordance with a more limited aspect of the present invention, the annular hoops are concentrically arranged on the front sides of the first and second ferrous pole pieces.

In accordance with a more limited aspect of the present invention, the source of magnetic flux includes superconducting coils arranged circumferentially about the first and second ferrous pole pieces.

In accordance with another aspect of the present invention, a pole piece assembly for homogenizing a main magnetic field produced in an examination region of an MRI apparatus is provided. The MRI apparatus includes: at least one annular magnet located adjacent a magnetic flux return path for generating the main magnetic field through the examination region; a couch which supports a subject to be examined within the examination region; a gradient coil assembly which generates substantially linear magnetic gradients across the main magnetic field in the examination region; a radio frequency coil disposed adjacent the examination region for transmitting radio frequency signals into the examination region and selectively exciting dipoles disposed therein; a radio frequency transmitter for driving the radio frequency coil; a receiver which receives magnetic resonance signals from resonating dipoles within the examination region; and, an image processor which reconstructs an image representation from received magnetic resonance signals for display on a human-readable display. The pole piece assembly includes a first disk-shaped ferrous pole piece positioned on a first side of the examination region.

The first pole piece has a front side facing the examination region and a back side facing the magnetic flux return path. The pole piece assembly also includes an array of annular hoops arranged on the first pole piece. The annular hoops are made from a material having at least one magnetic property different from that of the first pole piece.

In accordance with a more limited aspect of the present invention, the pole piece assembly further includes a second disk-shaped ferrous pole piece positioned on a second side of the examination region which is opposite the first side. The second pole piece also has a front side facing the examination region and a back side facing the magnetic flux return path. Also included is an array of annular hoops arranged on the second pole piece. Again, the annular hoops are made from a material having at least one magnetic property different from that of the second pole piece.

In accordance with another aspect of the present invention, a method of homogenizing a magnetic flux in an imaging volume of a magnetic resonance imaging scanner is provided. It includes generating the magnetic flux in the imaging volume. A pair of parallel circularly symmetrical disk-shaped regions are defined such that they are arranged symmetrically with respect to one another on opposite sides of the imaging volume. Magnetic properties of material occupying each of the disk-shaped regions are spatially varied.

In accordance with a more limited aspect of the present invention, the method further includes defining spaced arrays of concentric annular hoops in the disk-shaped regions. Material coincident with the annular hoops is made to have magnetic properties that are different from those of other material occupying the disk-shaped regions.

In accordance with a more limited aspect of the present invention, material coincident with at least one of the annular hoops is permanently magnetized.

In accordance with a more limited aspect of the present invention, the permanently magnetized material is magnetically aligned with the magnetic flux in the imaging volume such that in a region thereof, the magnetic flux in the imaging volume is concentrated.

In accordance with a more limited aspect of the present invention, the permanently magnetized material is magnetically anti-aligned with the magnetic flux in the imaging volume such that in a region thereof, the magnetic flux in the imaging volume is reduced.

In accordance with a more limited aspect of the present invention, material coincident with at least one of the annular hoops is made to have a magnetic susceptibility that is different from that of other material occupying the disk-shaped regions.

One advantage of the present invention is an improved pole piece for MRI scanners.

Another advantage of the present invention is improved homogeneity of the magnetic flux in the imaging volume.

Another advantage of the present invention is that openness is preserved and an improved patient gap-to-pole piece diameter ratio is achieved.

Yet another advantage of the present invention is that the amp-turns employed to drive the system are lower than those used with systems having pole pieces with contour features on their back sides.

Another advantage of the present invention is the higher quality images resulting from the improved uniformity of the magnetic field in the imaging volume.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
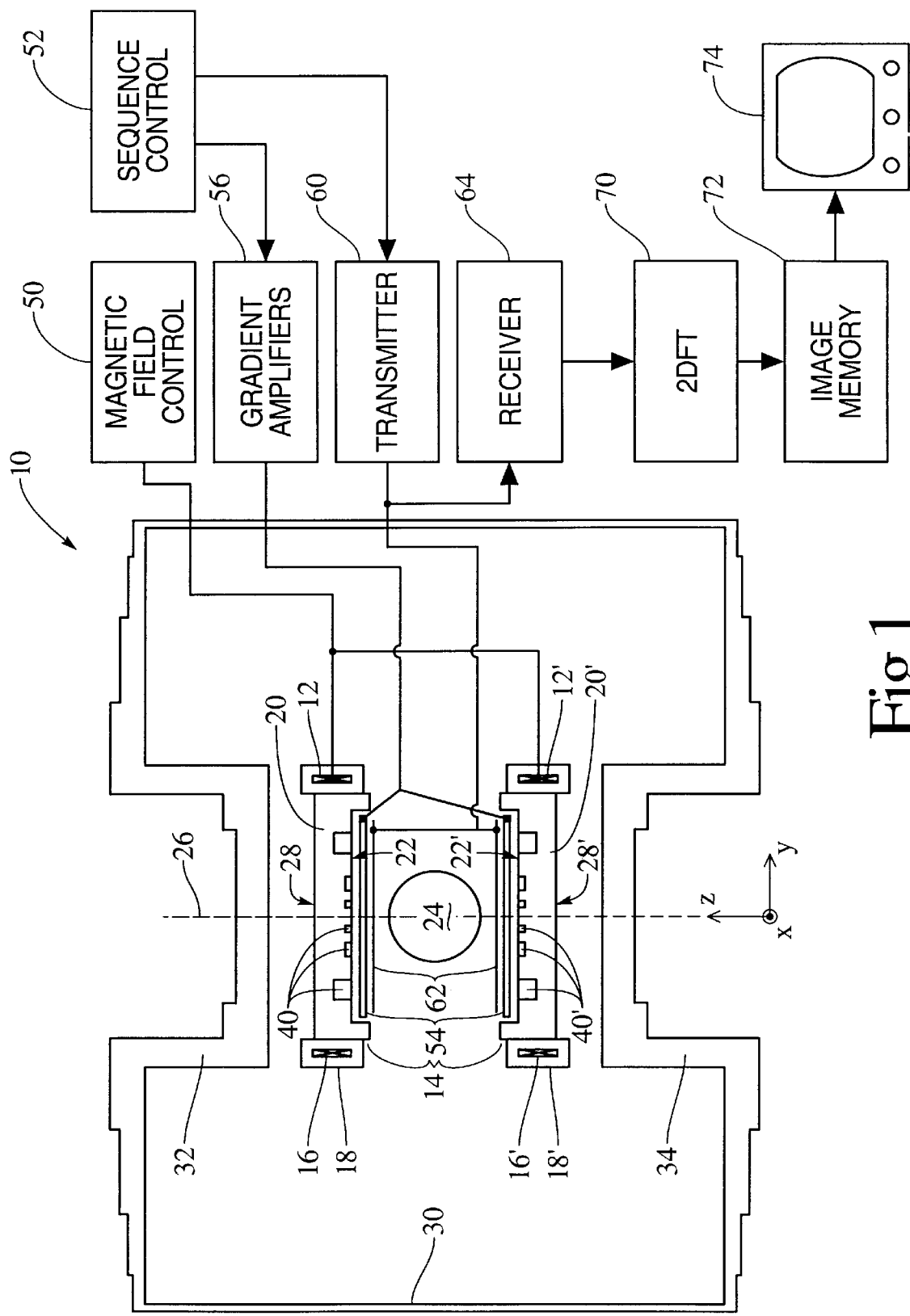
FIG. 1 is a diagrammatic illustration of an MRI scanner in accordance with aspects of the present invention; and, FIG. 2 is a diagrammatic illustration of a front face of a pole piece in accordance with aspects of the present invention.

With reference to FIG. 1, a magnetic resonance imaging scanner 10 includes annular primary magnets 12 and 12' which are disposed in a pair of parallel horizontal planes to define a patient gap 14 therebetween. Preferably, the magnets 12 and 12' are superconducting magnets. To this end, the magnets 12 and 12' are disposed in annular helium cans 16 and 16' that are surrounded by vacuum dewars 18 and 18'. Alternately, resistive magnets are employed. A first or upper disk-shaped ferrous pole piece 20 is circumferentially surrounded by the annular magnet 12. Similarly, a second or lower disk-shaped ferrous pole piece 20' is circumferentially surrounded by the annular magnet 12'. The first and second pole pieces 20 and 20' have front sides 22 and 22', respectively, which face one another from across the patient receiving gap 14 through an imaging volume 24 located therein. Preferably, the upper and lower pole pieces 20 and 20' are symmetrical to one another, are symmetrical with respect to the imaging volume 24, and are circularly symmetrical with respect to a central vertical axis 26.

A couch (not shown) suspends a subject to be examined at least partially within the patient receiving gap 14 (i.e., so that a region of interest is in the imaging volume 24).

A magnetic flux return path 30 extends from a point adjacent a back side 28 of the first or upper pole piece 20 remotely from the imaging volume 24 to a point adjacent a back side 28' of the second or lower pole piece 20'. More specifically, the pole pieces 20 and 20' are disposed centrally in an RF room which is defined by or lined with iron, including a ceiling layer, a floor layer, and wall layers. The ceiling, floor, and wall layers are composed of multiple sections which are mechanically connected together to thereby form the magnetic flux return path 30. Alternately, the magnetic flux return path 30 is of the appropriate type for the application in which it is employed, such as a C-shaped magnetic flux return path, an H-shaped magnetic flux return path, a four-poster magnetic flux return path, and the like. In a preferred embodiment, the pole pieces 20 and 20' are displaced from one another by a distance 2A and are each displaced from the ceiling and floor iron layers, respectively, by a distance 1A. In this manner, each magnet 12 and 12' and pole piece 20 and 20' is attracted to the magnetic reflection of itself in the adjoining iron layer. By positioning the pole pieces 20 and 20' symmetrically between each other and the iron layer, the attractive force between the magnets 12 and 12' is balanced against the attractive force between each magnet and its attraction to its magnetic image mirrored in the floor and ceiling structure. The magnets 12 and 12' and the pole pieces 20 and 20' are positioned in the room such that the net axial magnetic forces on the coils and pole pieces

20 and 20' are substantially balanced. Of course, for patient safety, convenience in bringing the magnets 12 and 12' up to field, and supporting gravity weight, the pole pieces 20 and 20' and magnets 12 and 12' are supported to the ceiling and floor, respectively, by non-ferrous, non-magnetic support structures (not shown). Additionally, the support structures within the cryostats of the superconducting magnet assemblies are configured for minimal thermal conductivity to minimize heat loss but consistent with design parameters for safety, field energizing, weight, and residual forces due to misalignment.

In a preferred embodiment, the spacing of the magnetic flux return path 30 including the iron ceiling and floor layers is selected to be an appropriate height for the attending physicians and equipment positioned within the room, typically 240 cm or more. The spacing of the magnetic flux return path 30 adjacent the back sides 28 and 28' of the pole pieces 20 and 20', as discussed above, is preferably selected to be about twice the vertical dimension of the patient receiving gap 14. For a typical 65 cm gap, the ceiling and floor layers of the magnetic flux return path 30 include projections 32 and 34, respectively, which are spaced about 130 cm from each other. Of course, the projections 32 and 34 need not be the same. Rather, their relative projection is selected such that a horizontal center of the patient receiving gap 14 is at a convenient height for attending physicians, attendants, and technicians.

For magnets 12 and 12' which generate a 0.5 T flux in the imaging volume 24 of the patient gap 14 and which are separated by about 65 cm from one another and about 32.5 cm from the ceiling and floor layers, a total flux through the magnetic flux return path 30 is about 1.0 Wb. To accommodate this flux, the projections 32 and 34 have a thickness of about 13 cm. At about 2 m out, the ceiling and floor layers can be tapered to about 8 cm. The wall layers, which vary with the dimension of the room, are selected to have sufficient thickness to provide radio frequency (RF) shielding, magnetic shielding, and a flux return path 30 which does not saturate, as well as providing support for the ceiling layer. A typical 0.5 T magnetically shielded room receives about 35 tons of iron, which is transported in sections or panels and assembled on site using conventional room-construction techniques.

With reference to FIG. 2 and continuing reference to FIG. 1, the ferrous pole pieces 20 and 20' operate to homogenize or otherwise make uniform the main magnetic field or magnetic flux through the imaging volume 24. To further their effectiveness in this regard, the pole pieces 20 and 20' are each integrated with an array of annular hoops 40 and 40', respectively. In a preferred embodiment, the annular hoops 40 and 40' are concentrically arranged on the front sides 22 and 22' of the first and second ferrous pole pieces 20 and 20'. The annular hoops 40 and 40' are made of a material having magnetic properties different from those of the pole pieces 20 and 20'. In a preferred embodiment, the annular hoops 40 and 40' are made from permanently magnetized material. In this manner, a particular annular hoop is magnetically aligned, or alternately, anti-aligned, with the magnetic flux in the imaging volume, 24, such that the magnetic flux is concentrated, or alternately, reduced, in a region of the particular annular hoop. Thereby, particular perturbations in the uniformity or homogeneity of the magnetic field through the imaging volume 24 are adjusted and/or eliminated. For those applications where magnetic fields in the vicinity of the poles 20 and 20' do not exceed about 1.0 T, appropriate materials for the permanent magnet annular hoops 40 and 40' are neodymium boron iron, and the like. In a preferred method of construction, annular grooves are cut into the pole piece. The grooves are filled with powdered or pelletized permanently magnetized material bonded in place with a resin, such as epoxy, or contained in a tubular construction. Alternately, hoop segments of permanently magnetized material, preferably scintered, are assembled in the grooves to define the hoops. As another alternative, plates of the permanently magnetized material are loaded into the grooves.

In an alternative approach, instead of using a permanent magnet material for the annular hoops 40 and 40', a material is used that has a different magnetic susceptibility than that of the pole pieces 20 and 20'. Appropriate materials for this alternate approach include a nickel iron alloy, a cobalt steel alloy, and the like. Generally, this alternate approach is most advantageous when the magnetic fields in the vicinity of the pole pieces 20 and 20' approach 1.0 T and/or when used as part of, or near, a Rose shim. The exact diameter, width, size, arrangement, and number of the annular hoops 40 and 40' is mathematically estimated and iteratively adjusted until the magnetic field through the imaging volume 24 is optimized. In a preferred embodiment, a non-linear finite element model is employed for the design process. It is to be appreciated that the diameter, width, size, arrangement, and number of annular hoops 40 and 40' vary with the strength of the main magnetic field and the geometry of the magnets 12 and 12' and the pole pieces 20 and 20'. Furthermore, in addition to the annular hoops 40 and 40', the surfaces of the ferrous pole pieces 20 and 20' are optionally shaped or contoured with ridges and air-filled grooves to achieve a further degree of uniformity in the magnetic flux through the imaging volume 24.

In operation, a source of magnetic flux generates the magnetic flux through the imaging volume 24, the pair of opposing pole pieces 20 and 20', and the magnetic flux return path 30. More specifically, a main magnetic field control 50 controls the superconducting magnets 12 and 12' positioned around the ferrous pole pieces 20 and 20' such that a substantially uniform, temporally constant main magnetic field is created along a z direction through the imaging volume 24. Alternately, the magnets 12 and 12' are resistive and/or are placed at other positions adjacent the magnetic flux return path 30 as desired for particular applications.

A magnetic resonance echo means operated under the control of a sequence control circuit 52 applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate MRI and spectroscopy sequences. More specifically, a gradient coil assembly 54 selectively creates magnetic gradients in the main magnetic field across the imaging volume 24 via gradient current amplifiers 56 that apply electrical current pulses to the gradient coil assembly 54. Preferably, the gradient coil assembly 54 includes self-shielded gradient coils for producing magnetic gradients along three mutually orthogonal directions, x, y, and z.

An RF transmitter 60 transmits radio frequency pulses or pulse packets to a whole-body RF coil 62 disposed adjacent the imaging volume 24 to transmit RF pulses into the imaging volume 24. A typical RF pulse is composed of a packet of immediately contiguous pulse segments of short duration which, taken together with each other and any applied gradients, achieve a selected magnetic resonance manipulation. The RF pulses are used to saturate, excite resonance, invert magnetization, refocus magnetization, or manipulate resonance in selected portions of the imaging volume 24. For whole-body applications, the resonance signals are commonly picked up by the whole-body RF coil 62. The RF coil may be disposed near the opposing pole pieces 20 and 20', (as is the whole-body RF coil 62 illustrated) or on the patient or subject being examined. For example, a surface coil may be positioned contiguous to the patient or subject being examined for controllably inducing magnetic resonance in a selected region of the patient or subject.

A receiver 64 (preferably a digital receiver) receives signals from resonating dipoles. The signals are received via the same RF coil that transmits the radio frequency pulses. Alternately, separate receiver coils may be used. For example, receive-only surface coils may be disposed continuous to a selected region of the patient or subject being examined to receive resonance induced therein by the whole-body RF transmitting coil 62. The sequence control circuit 52 controls the gradient pulse amplifiers 56 and the RF transmitter 60 to generate any of a plurality of multiple echo sequences, such as echo-planar imaging, echo-volume imaging, gradient and spin-echo imaging, fast spin-echo imaging, and the like. For the selected sequence, the receiver 64 receives a plurality of data inputs in rapid succession following each RF excitation pulse. Ultimately, the radio frequency signals received are demodulated and reconstructed into an image representation by a reconstruction processor 70 which applies a two-dimensional Fourier transform or other appropriate reconstruction algorithm. The image may represent a planar slice through the patient, an array of parallel planar slices, a three-dimensional volume, or the like. The image is then stored in an image memory 72 where it may be accessed by a display, such as a video monitor 74 which provides a human-readable display of the resultant image.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging scanner comprising:
   a pair of opposing pole pieces disposed symmetrically about an imaging volume facing one another, said pair of opposing pole pieces including;
      a first ferrous pole piece having a front side facing the imaging volume and a back side;
      a second ferrous pole piece having a front side facing the imaging volume and a back side; and,
      a plurality of annular hoops integrated with each of the pole pieces, each annular hoop being formed of a multiplicity of separate elements and of a material with a magnetic susceptibility different from the pole pieces;
   a source of magnetic flux which generates a magnetic flux through the imaging volume and the pair of opposing pole pieces.

2. The magnetic resonance imaging scanner according to claim 1, wherein the annular hoops are concentrically arranged on the front sides of the first and second ferrous pole pieces.

3. The magnetic resonance imaging scanner according to claim 1, wherein the source of magnetic flux includes superconducting coils arranged circumferentially about the first and second ferrous pole pieces.

4. The magnetic resonance imaging scanner as set forth in claim 1 wherein each annular hoop is formed of at least one of powdered material, pelletized material, sintered material, and plates.

5. A magnetic resonance imaging scanner comprising:
   a pair of opposing pole pieces disposed symmetrically about an imaging volume facing one another, said pair of opposing pole pieces including:
      a first ferrous pole piece having a front side facing the imaging volume and a back side; and,
      a second ferrous pole piece having a front side facing the imaging volume and a back side;
   a source of magnetic flux which generates a magnetic flux through the imaging volume, and the pair of opposing pole pieces;
   a number of annular hoops of permanently magnetized material integrated with the pair of opposing pole pieces for homogenizing the magnetic flux through the imaging volume.

6. The magnetic resonance imaging scanner according to claim 5, wherein at least one of the annular hoops is magnetically aligned with the magnetic flux in the imaging volume such that the magnetic flux in the imaging volume is concentrated in a region of the at least one annular hoop.

7. The magnetic resonance imaging scanner according to claim 5, wherein at least one of the annular hoops is magnetically anti-aligned with the magnetic flux in the imaging volume such that the magnetic flux in the imaging volume is reduced in a region of the at least one annular hoop.

8. A magnetic resonance imaging scanner comprising:
   a pair of opposing pole pieces disposed symmetrically about an imaging volume facing one another, said pair of opposing pole pieces including;
      a first ferrous pole piece having a front side facing the imaging volume and a back side;
      second ferrous pole piece having a front side facing the imaging volume and a back side;
      a number of annular hoops integrated with the pair of opposing pole pieces for homogenizing the magnetic flux through the imaging volume, said annular hoops being made of a material different from a remainder of the pole pieces and selected from a group consisting of neodymium boron iron, and samarium cobalt
   a source of magnetic flux which generates a magnetic flux through the imaging volume and the pair of opposing pole pieces.

9. A pole piece assembly for homogenizing a main magnetic field produced in an examination region of a magnetic resonance imaging apparatus; said magnetic resonance imaging apparatus having at least one magnet for generating said main magnetic field through said examination region; a couch which supports a subject to be examined within said examination region; a gradient coil assembly which generates substantially linear magnetic gradients across said main magnetic field in said examination region; a radio frequency coil disposed adjacent said examination region for transmitting radio frequency signals into said examination region and selectively exciting dipoles disposed therein; a radio frequency transmitter for driving said radio frequency coil; a receiver which receives magnetic resonance signals from resonating dipoles within said examination region; and, an image processor which reconstructs an image representation from received magnetic resonance signals for display on a human-readable display; said pole piece assembly comprising:

a first ferrous pole piece positioned on a first side of said examination region, said first pole piece having a front side facing said examination region and a back side; and, an array of annular hoops arranged on or near said first pole piece, said annular hoops being made from a material having a different magnetic susceptibility from that of said first pole piece such that the hoops have a different magnetization from the first pole piece in the presence of the magnetic field.

10. The pole piece assembly according to claim 9, further comprising:

a second ferrous pole piece positioned on a second side of said examination region opposite said first side, said second pole piece having a front side facing said examination region and a back side; and, an array of annular hoops arranged on or near said second pole piece, said annular hoops being made from a material having at least one magnetic property different from that of said second pole piece.

11. The pole piece assembly according to claim 9, wherein said array of annular hoops are concentrically arranged on or near said front side of said first pole piece.

12. The pole piece assembly according to claim 9, wherein at least one of said array of annular hoops is made out of a material having a magnetic susceptibility different from that of said first pole piece.

13. A pole piece assembly for homogenizing a main magnetic field produced in an examination region of a magnetic resonance imaging apparatus; said magnetic resonance imaging apparatus having at least one for generating said main magnetic field through said examination region; a support which supports an object to be examined within said examination region; a radio frequency coil disposed adjacent said examination region for transmitting radio frequency signals into said examination region and selectively exciting dipoles disposed therein; a radio frequency transmitter for driving said radio frequency coil; a receiver which receives magnetic resonance signals from resonating dipoles within said examination region; said pole piece assembly comprising:

a first ferrous pole piece positioned on a first side of said examination region, said first pole piece having a front side facing said examination region and a back side; and, an array of annular hoops arranged on or near said first pole piece, said annular hoops being made from a material having at least one magnetic property different from that of said first pole piece and at least one of said array of annular hoops being made out of a permanent magnet material.

14. A method of homogenizing a magnetic field in an imaging volume of a magnetic resonance imaging scanner comprising:

(a) defining a pair of parallel circularly symmetrical circular-shaped regions arranged symmetrically with respect to one another on opposite sides of the imaging volume;

(b) defining spaced arrays of concentric annular hoops in the circular-shaped region, the annular hoops having a higher magnetic susceptibility than other material occupying the circular-shaped regions; and, (c) generating a magnetic field in the imaging volume and improving a homogeneity of the magnetic field in the imaging volume with differential magnetic effects from the high susceptibility annular hoops.

15. The method according to claim 14 further comprising:

causing material coincident with at least one of the annular hoops to have a magnetic susceptibility that is different from that of other material occupying the circular-shaped regions.

16. A method of homogenizing a magnetic flux in an imaging volume of a magnetic resonance imaging scanner comprising:

(a) defining a pair of parallel circularly symmetrical circular-shaped regions arranged symmetrically with respect to one another on opposite sides of the imaging volume;

(b) generating the magnetic flux in the imaging volume;

(c) adjusting homogeneity of the magnetic flux in the imaging volume with permanently magnetized material in the circularly-shaped regions.

17. The method according to claim 16, wherein the permanently magnetized material is magnetically aligned with the magnetic flux in the imaging volume such that in a region thereof, the magnetic flux in the imaging volume is concentrated.

18. The method according to claim 16, wherein the permanently magnetized material is magnetically anti-aligned with the magnetic flux in the imaging volume such that in a region thereof, the magnetic flux in the imaging volume is reduced.

19. A method of homogenizing a magnetic flux in an examination volume of a magnetic resonance scanner comprising:

(a) cutting annular grooves in a pair of circular-shaped ferrous pole elements;

(b) at least partially filling the annular grooves with at least one material that has a magnetic property different from the ferrous pole elements, to vary at least one magnetic property at the annular grooves relative to a remainder of the pole elements;

(c) positioning the pair of circular-shaped ferrous pole elements symmetrically with respect to one another on opposite sides of the examination volume;

(d) generating the magnetic field in the examination volume between the pole elements.

* * * * *